(12) United States Patent
Wu et al.

(10) Patent No.: US 11,848,304 B2
(45) Date of Patent: Dec. 19, 2023

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Shang-Yun Hou, Jubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/869,034

(22) Filed: Jul. 20, 2022

(65) Prior Publication Data
US 2022/0359460 A1 Nov. 10, 2022

Related U.S. Application Data

(62) Division of application No. 16/657,615, filed on Oct. 18, 2019, now Pat. No. 11,410,968.

(51) Int. Cl.
*H01L 23/495* (2006.01)
*H01L 23/00* (2006.01)
*H01L 23/31* (2006.01)
*H01L 23/498* (2006.01)

(52) U.S. Cl.
CPC .......... *H01L 24/97* (2013.01); *H01L 23/3114* (2013.01); *H01L 23/49827* (2013.01); *H01L 23/49861* (2013.01); *H01L 2224/80895* (2013.01); *H01L 2224/82896* (2013.01)

(58) Field of Classification Search
CPC . H01L 24/97; H01L 23/3114; H01L 23/49827
USPC ........................................................ 257/666
See application file for complete search history.

(56) References Cited

U.S. PATENT DOCUMENTS

| | | | |
|---|---|---|---|
| 6,501,175 | B2 | 12/2002 | Yamashita |
| 8,779,606 | B2 | 7/2014 | Yim et al. |
| 9,356,006 | B2 | 5/2016 | Haba et al. |
| 9,461,018 | B1 | 10/2016 | Tsai et al. |
| 9,666,502 | B2 | 5/2017 | Chen et al. |
| 10,153,222 | B2 | 12/2018 | Yu et al. |
| 10,468,379 | B1 | 11/2019 | Liu et al. |

(Continued)

FOREIGN PATENT DOCUMENTS

| | | | |
|---|---|---|---|
| KR | 20160107731 A | 9/2016 | |
| KR | 20160144367 A | 12/2016 | |

(Continued)

*Primary Examiner* — Nitin Parekh
(74) *Attorney, Agent, or Firm* — Slater Matsil, LLP

(57) ABSTRACT

A semiconductor device includes a first Chip-On-Wafer (CoW) device having a first interposer and a first die attached to a first side of the first interposer; a second CoW device having a second interposer and a second die attached to a first side of the second interposer, the second interposer being laterally spaced apart from the first interposer; and a redistribution structure extending along a second side of the first interposer opposing the first side of the first interposer and extending along a second side of the second interposer opposing the first side of the second interposer, the redistribution structure extending continuously from the first CoW device to the second CoW device.

20 Claims, 11 Drawing Sheets

(56) References Cited

U.S. PATENT DOCUMENTS

| | | | |
|---|---|---|---|
| 10,504,824 B1 | 12/2019 | Pan et al. | |
| 10,566,229 B2* | 2/2020 | Shih | H01L 21/6835 |
| 2004/0038021 A1 | 2/2004 | Nagai et al. | |
| 2013/0062761 A1* | 3/2013 | Lin | H01L 21/565 |
| | | | 257/737 |
| 2015/0287697 A1 | 10/2015 | Tsai et al. | |
| 2015/0296616 A1 | 10/2015 | Jomaa et al. | |
| 2015/0333046 A1 | 11/2015 | Makihata et al. | |
| 2017/0117200 A1 | 4/2017 | Kim et al. | |
| 2017/0365587 A1 | 12/2017 | Hung et al. | |
| 2018/0190635 A1 | 7/2018 | Choi et al. | |
| 2018/0337130 A1* | 11/2018 | Chang Chien | H01L 23/5383 |
| 2019/0067157 A1 | 2/2019 | Lin et al. | |
| 2019/0109117 A1 | 4/2019 | Fang et al. | |
| 2020/0027837 A1* | 1/2020 | Jeng | H01L 23/3135 |
| 2020/0402892 A1* | 12/2020 | Chen | H01L 23/5389 |
| 2020/0411443 A1* | 12/2020 | Guo | H01L 24/09 |

FOREIGN PATENT DOCUMENTS

| | | |
|---|---|---|
| KR | 20170047019 A | 5/2017 |
| KR | 20170126190 A | 11/2017 |
| KR | 20180079007 A | 7/2018 |
| KR | 20180113901 A | 10/2018 |
| TW | 201834086 A | 9/2018 |
| TW | 201913920 A | 4/2019 |

* cited by examiner

SEMICONDUCTOR DEVICE AND METHOD OF FORMING THE SAME

PRIORITY CLAIM AND CROSS-REFERENCE

This application is a divisional of U.S. patent application Ser. No. 16/657,615, filed on Oct. 18, 2019 and entitled "Semiconductor Device and Method of Forming the Same," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure. In some embodiments, to form a CoWoS device, a plurality of semiconductor chips are attached to a wafer, and a dicing process is performed next to separate the wafer into a plurality of interposers, where each of the interposers has one or more semiconductor chips attached thereto. The interposer with semiconductor chips(s) attached is referred to as a Chip-On-Wafer (CoW) device. The CoW device is then attached to a substrate (e.g., a printed circuit board) to form a CoWoS device. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
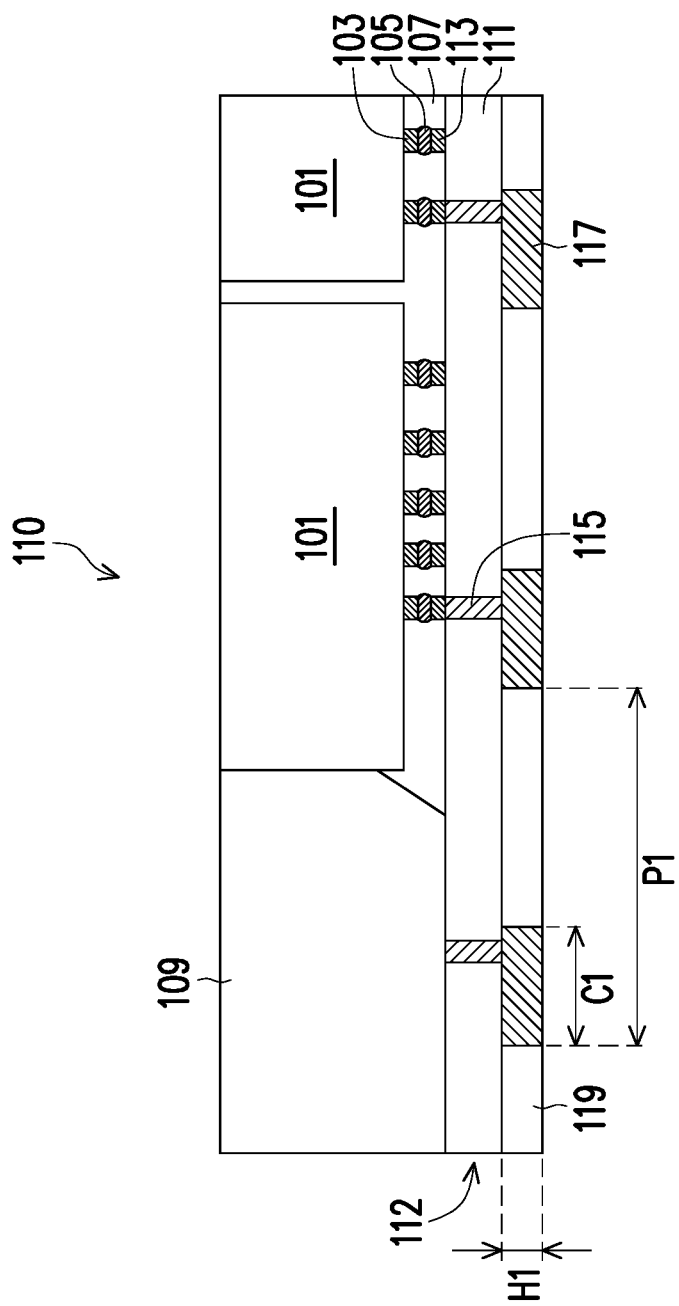
FIG. 1 illustrates a cross-sectional view of a Chip-On-Wafer (CoW) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor device 110 with a Chip-On-Wafer (CoW) structure (also referred to as a CoW device), in accordance with some embodiments. For simplicity, FIG. 1 only shows a left portion of the semiconductor device 110, and the right portion of the semiconductor device 110 may be the same as (e.g., symmetric to) or similar to the left portion shown in FIG. 1, as one skilled in the art readily appreciates.

To form the semiconductor device 110, one or more dies 101 (may also be referred to as semiconductor dies, chips, or integrated circuit (IC) dies) are attached to an interposer 112. The dies 101 are a same type of dies (e.g., memory dies, or logic dies), in some embodiments. In other embodiments, the dies 101 are of different types, e.g., some dies 101 are logic dies and others dies 101 are memory dies. Although two dies 101 are illustrated in FIG. 1, the number of dies 101 attached to the interposer 112 may be any suitable number, as one skilled in the art readily appreciates.

Each of the dies 101 includes a substrate, electrical components (e.g., transistors, resistors, capacitors, diodes, or the like) formed in/on the substrate, and an interconnect structure over the substrate connecting the electrical components to form functional circuits of the die 101. The die 101 also includes conductive pillars 103 (also referred to as die connectors) that provide electrical connection to the circuits of the die 101.

The substrate of the die 101 may be a semiconductor substrate, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The electrical components of the die 101 comprise a wide variety of active devices (e.g., transistors) and passive devices (e.g., capacitors, resistors, inductors), and the like. The electrical components of the die 101 may be formed using any suitable methods either within or on the substrate of the die 101. The interconnect structure of the die 101 comprises one or more metallization layers (e.g., copper layers) formed in one or more dielectric layers, and is used to connect the various electrical components to form functional circuitry. In an embodiment the interconnect structure is formed of alternating layers of dielectric and conductive material (e.g., copper) and may be formed through any suitable process (such as deposition, damascene, dual damascene, etc.).

One or more passivation layers (not shown) may be formed over the interconnect structure of the die 101 in order to provide a degree of protection for the underlying structures of the die 101. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads (not shown) may be formed over the passivation layer and may extend through the passivation layer to be in electrical contact with the interconnect structure of the die 101. The conductive pads may comprise aluminum, but other materials, such as copper, may alternatively be used.

Conductive pillars 103 of the die 101 are formed on the conductive pads to provide conductive regions for electrical connection to the circuits of the die 101. The conductive pillars 103 may be copper pillars, contact bumps such as micro-bumps, or the like, and may comprise a material such as copper, tin, silver, or other suitable material.

Looking at the interposer 112, which includes a substrate 111, through vias 115 (also referred to as through-substrate vias (TSVs)), and conductive pads 113/117 on upper/lower surfaces of the substrate 111. FIG. 1 also illustrates a passivation layer 119 (e.g., a polymer layer) of the interposer 112 disposed on the lower surface of the substrate 111, which passivation layer 119 surrounds and contacts (e.g., physically contacts) the conductive pads 117. In other embodiments, the passivation layer 119 is omitted.

The substrate 111 may be, e.g., a silicon substrate, doped or undoped, or an active layer of a silicon-on-insulator (SOI) substrate. However, the substrate 111 may alternatively be a glass substrate, a ceramic substrate, a polymer substrate, or any other substrate that may provide a suitable protection and/or interconnection functionality.

In some embodiments, the substrate 111 may include electrical components, such as resistors, capacitors, signal distribution circuitry, combinations of these, or the like. These electrical components may be active, passive, or a combination thereof. In other embodiments, the substrate 111 is free from both active and passive electrical components therein. All such combinations are fully intended to be included within the scope of this disclosure.

Through vias 115 extend from the upper surface of the substrate 111 to the lower surface of the substrate 111, and provide electrical connections between the conductive pads 113 and 117. The through vias 115 may be formed of a suitable conductive material such as copper, tungsten, aluminum, alloys, doped polysilicon, combinations thereof, and the like. A barrier layer may be formed between the through vias 115 and the substrate 111. The barrier layer may comprise a suitable material such as titanium nitride, although other materials, such as tantalum nitride, titanium, or the like, may alternatively be utilized.

In some embodiments, a pitch P1 between adjacent conductive pads 117 is between about 20 µm and about 200 µm, a critical dimension (CD) (e.g., a width) C1 of the conductive pads 117 is between about 10 µm and about 100 µm, and a height H1 of the conductive pads 117 is between about 3 µm and about 30 µm.

As illustrated in FIG. 1, the conductive pillar 103 of the dies 101 are bonded to the conductive pads 113 of the interposer 112 by, e.g., solder regions 105. A reflow process may be performed to bond the dies 101 to the interposer 112.

After the dies 101 are bonded to the interposer 112, an underfill material 107 is formed between the dies 101 and the interposer 112. The underfill material 107 may, for example, comprise a liquid epoxy that is dispensed in a gap between the dies 101 and the interposer 112, e.g., using a dispensing needle or other suitable dispensing tool, and then cured to harden. As illustrated in FIG. 1, the underfill material 107 fills the gap between the dies 101 and the substrate 111 of the interposer 112, and may also fill gaps between sidewalls of the dies 101. In other embodiments, the underfill material 107 is omitted, in which case a subsequently formed molding material (e.g., 109) may fill the gaps between the dies 101 and the substrate 111 and between the dies 101.

Next, a molding material 109 is formed over the interposer 112 and around the dies 101. The molding material 109 also surrounds the underfill material 107 in embodiments where the underfill material 107 is formed. The molding material 109 may comprise an epoxy, an organic polymer, a polymer with or without a silica-based filler or a glass filler added, or other materials, as examples. In some embodiments, the molding material 109 comprises a liquid molding compound (LMC) that is a gel type liquid when applied. The molding material 109 may also comprise a liquid or solid when applied. Alternatively, the molding material 109 may comprise other insulating and/or encapsulating materials. The molding material 109 is applied using a wafer level molding process in some embodiments. The molding material 109 may be molded using, for example, compressive molding, transfer molding, molded underfill (MUF) or other methods.

Next, the molding material 109 is cured using a curing process, in some embodiments. The curing process may comprise heating the molding material 109 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 109 may be cured using other methods. In some embodiments, a curing process is not included.

After the molding material 109 is formed, a planarization process, such as chemical and mechanical planarization (CMP), may be performed to remove excess portions of the molding material 109 from over the dies 101, such that the molding material 109 and the dies 101 have a coplanar upper surface. As illustrated in FIG. 1, the molding material 109 is conterminous with the substrate 111 such that sidewalls of the molding material 109 are aligned with respective sidewalls of the substrate 111.

In the example of FIG. 1, the CoW device 110 includes the interposer 112, dies 101, the underfill material 107 and the molding material 109. In some embodiments, the underfill material 107 is not formed and is replaced by the molding material 109. Although not illustrated, one skilled in the art will readily appreciate that a plurality of CoW devices 110 may be formed in a same processing step(s) on a same wafer, and a dicing process may then be performed to separate the plurality of CoW devices 110 into separate (e.g., individual) CoW devices 110.

The CoW devices 110 may be bonded to a substrate (e.g., a printed circuit board (PCB)) to form a semiconductor device with a Chip-On-Wafer-On-Substrate (CoWoS) structure. To form high performance semiconductor devices, such as those designed for artificial intelligence (AI) or network server applications, more and more dies 101 are integrated into the CoW device 110 to provide enhanced functionalities and/or more storage capacity (e.g., memory capacity). As the number of dies in the CoW device increases, the size of the interposer may have to be increased to accommodate the dies. For example, a high performance semiconductor device with a CoW structure may have a size (e.g., surface area in a top view) larger than 3 reticles, where a reticle corresponds to an area of about 26 mm by 32 mm. When the high performance device with the CoW structure is bonded to a substrate (e.g., a PCB), the size of the substrate may be larger than 70 mm by 70 mm, such as 100 mm by 100 mm.

However, as the size of the interposer (e.g., 112) and the size of the substrate (e.g., PCB) increase, new challenges arise. For example, due to the difference in the coefficients of thermal expansion (CTEs) of the different materials in the CoW device 110, the interposer 112 may warp, and the warpage of the interposer may get worse when the size of the interposer increases. The warpage of the interposer may causes stress in the conductive connectors between the dies 101 and the interposer 112, where the conductive connectors includes the solder regions 105, the die connectors 103, and the conductive pads 113. The stress is especially high near corner regions (e.g., corner regions in a top view) of the interposer 112, and the high stress increases the bump fatigue risk when the size of the CoW device is large (e.g., larger than 2 reticles).

Another challenge with increased CoW device size is low bump joint yield, which may happen when the larger CoW device is bonded to a large substrate (e.g., a PCB) to form a CoWoS semiconductor device. This is because it is increasingly difficult to keep the large substrate (e.g., a PCB) flat (e.g., having planar upper surface and/or planar lower surface). The warpage of the large substrate makes it difficult to align the conductive pads 117 of the CoW device 110 with corresponding conductive features (e.g., conductive pads) on the surface of the large substrate for bonding. In addition, the conductive features (e.g., conductive pads) on the surface of large substrate are not disposed in a same plane due to warpage of the large substrate, making it difficult to bond the CoW device 110 with the large substrate. As a result, issues, such as cold joints, or high stress for conductive connectors between the CoW device 110 and the large substrate, may occur. The various reliability issues discussed above may be collectively referred to as chip package integration (CPI) issues or CPI risks. The present disclosure discloses various embodiments of a composite CoW structure to alleviate or avoid the CIP risks. Details of the composite CoW structure are discussed hereinafter.

Figure 2:
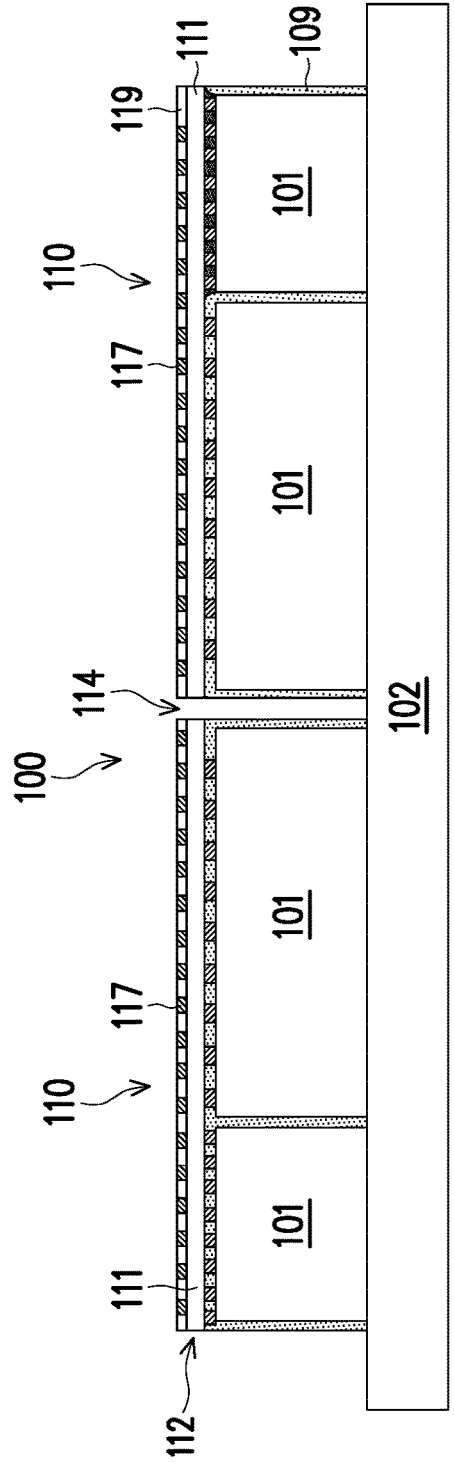
FIGS. 2-5, 6A, and 6B illustrate various views of a semiconductor device at various stages of manufacturing, in accordance with an embodiment.

FIGS. 2-5, 6A, and 6B illustrate various views of a semiconductor device 100 at various stages of manufacturing, in accordance with an embodiment. Referring to FIG. 2, two CoW devices 110, which may be the same as or similar to the CoW devices 110 of FIG. 1, are attached to an upper surface of a carrier 102. Note that although two CoW devices 110 are illustrated in FIG. 2, more than two CoW devices 110 may be used to form the semiconductor device 100, these and other variations are fully intended to be included within the scope of the present disclosure.

The carrier 102 may be made of a material such as silicon, polymer, polymer composite, metal foil, ceramic, glass, glass epoxy, beryllium oxide, tape, or other suitable material for structural support. In some embodiments, prior to attaching the CoW devices 110 to the carrier 102, a release film, such as a light-to-heat-conversion (LTHC) coating, is formed over the carrier 102. The release film may be photosensitive and may be easily detached from the carrier 102 by shining, e.g., an ultra-violet (UV) light on the carrier 102 in a subsequent carrier de-bonding process.

The CoW devices 110 are attached to carrier 102 (or to the release film if formed) using, e.g., die attaching film (DAF). Note that in FIG. 2, the backsides of the dies 101 are attached to the carrier 102, and the conductive pads 117 of the interposers 112 of the CoW devices 110 face upwards away from the carrier 102. The CoW devices 110 are laterally spaced apart from each other with a gap 114 in between.

Figure 3:
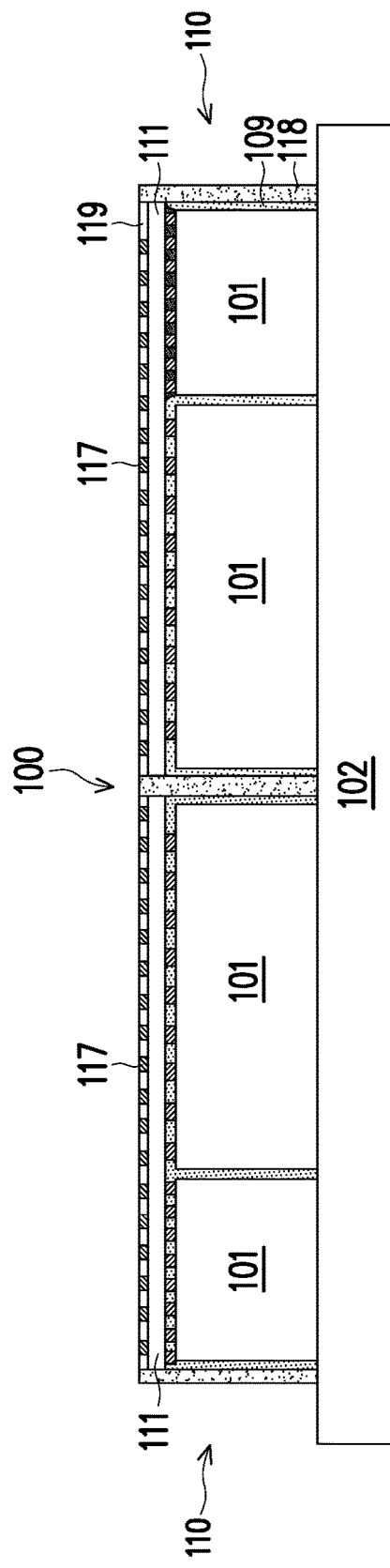

Next, in FIG. 3, a molding material 118 is formed over the carrier 102 around the CoW devices 110. The molding material 118 also fills the gap 114 between the CoW devices 110. The material and the formation method of the molding material 118 may be the same as or similar to those of the molding material 109 of the CoW device 110, thus details are not repeated. In some embodiments, the molding material 118 and the molding material 109 are different materials (e.g., having different compositions), and the molding material 118 surrounds and physically contacts the molding material 109. In other embodiments, the molding material 118 and the molding material 109 are the same material (e.g., having a same composition), thus there may or may not be an interface between the molding material 118 and the molding material 109.

After the molding material 118 are formed, a planarization process, such as CMP, may be performed to remove excess portions of the molding material 118 disposed over the CoW devices 110. After the planarization process, the molding material 118, the conductive pads 117, and the passivation layers 119 of the CoW devices 110 have a coplanar (e.g., level) upper surface. The molding material 118 physically contacts sidewalls of the substrates 111 and sidewalls of the passivation layers 119 in FIG. 3.

Figure 4:
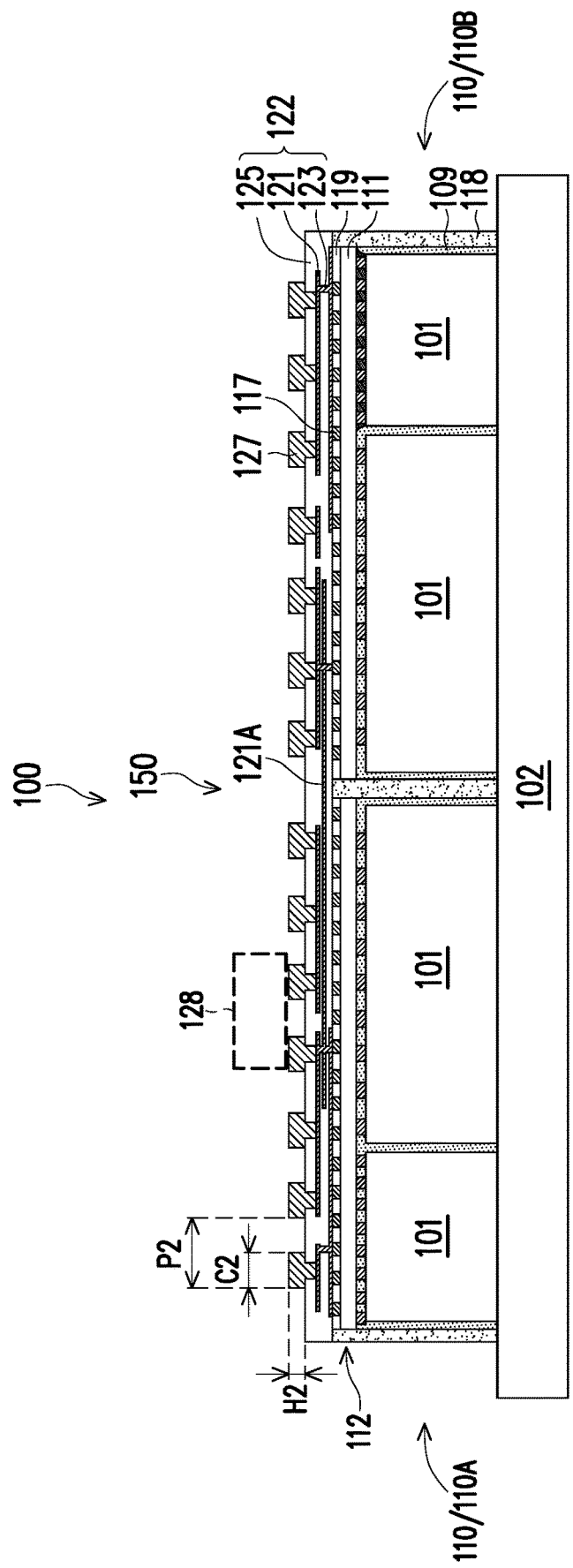

Next, in FIG. 4, a redistribution structure 122 is formed over the molding material 118 and the CoW devices 110. The redistribution structure 122 includes one or more dielectric layers 125, and conductive features (e.g., conductive lines 121 and vias 123) formed in the one or more dielectric layers 125. The redistribution structure 122 is electrically coupled to the conductive pads 117, and is electrically coupled to the dies 101 through the interposers of the CoW devices 110. Under bump metallurgy (UBM) structures 127 are formed over and electrically coupled to the redistribution structure 122. FIG. 4 further illustrates conductive lines 121A (e.g., copper lines) extending over the gap between the CoW devices 110. The conductive lines 121A electrically couples at least one of the dies 101 in the CoW device 110A (the CoW device 110 on the left) with at least one of the dies 101 in the CoW device 110B (the CoW device 110 on the right). The device illustrated in FIG. 4 (without the carrier 102), which includes a plurality of CoW devices 110 that are physically separated and electrically coupled together by a single redistribution structure 122, is also referred to as a composite CoW device 150, or a semiconductor device with a composite CoW structure.

In some embodiments, the one or more dielectric layers 125 are formed of a polymer, such as polybenzoxazole (PBO), polyimide, benzocyclobutene (BCB), or the like. In other embodiments, the dielectric layers 125 is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers 125 may be formed by any acceptable deposition process, such as spin coating, chemical vapor deposition (CVD), laminating, the like, or a combination thereof.

In some embodiments, the conductive features of the redistribution structure 122 comprise conductive lines 121/121A and via 123 formed of a suitable conductive material such as copper, titanium, tungsten, aluminum, or the like. The conductive features may be formed by, e.g., forming openings in the dielectric layer 125 to expose underlying conductive features, forming a seed layer over the dielectric layer 125 and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed.

In some embodiments, the redistribution structure has between 1 and 10 layers of metal layers, where each metal layer includes conductive lines 121 and vias 123 formed over/through a same dielectric layer 125. A thickness of each dielectric layer 125, measured along a first direction perpendicular to the major surface of the interposer of the CoW device 110, is between about 2 μm and about 10 μm, in some embodiments. A thickness of the conductive features (e.g., 121) of the redistribution structure 122, measured along the first direction, is between about 0.5 μm and about 5 μm.

The disclosed composite CoW device 150 provides excellent signal integrity. For example, due to the use of silicon fab processing techniques to form the redistribution structure 122, the roughness of the conductors (e.g., 121, 123) in the redistribution structure 122 is low (e.g., having a profile roughness parameter Ra≤0.1 μm), which helps to reduce insertion loss and skin effect. The dielectric layers 125 (e.g., polyimide) of the redistribution structure 122 are made to be thin (e.g., having a thickness between 2 μm and about 10 μm), which helps to reduce the equivalent series resistance (ESR) and the equivalent series inductance (ESL) of the dielectric layers 125, thereby reducing the dissipation factor Df (e.g., Df≤0.01) of the dielectric layers 125. The lower ESL and ESR of the dielectric layers 125 improve the power integrity of the composite CoW device 150. Optionally, one or more integrated passive devices (IPDs) (illustrated by the dashed box 128 in FIG. 4) may be integrated with the composite CoW device 150 (e.g., bonded to UBM structures 127), which reduces the number of power plan layers in the composite CoW device 150 and further improves the power integrity. As a result of the excellent signal integrity, the composite CoW device 150 is well suited for high speed devices such as Serializer/Deserializer (SerDes) devices.

After the redistribution structure 122 is formed, the UBM structures 127 are formed over the redistribution structure 122 and are electrically coupled to electrically conductive features of the redistribution structure 122. In an embodiment, the UBM structures 127 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 127. Any suitable materials or layers of material that may be used for the UBM structures 127 are fully intended to be included within the scope of the present disclosure.

The UBM structures 127 may be formed by: forming an opening in a topmost dielectric layer 125 to expose conductive features in the redistribution structure 122, forming a seed layer over the topmost dielectric layer 125 and along the interior of the opening in the topmost dielectric layer, forming a patterned mask layer (e.g., photoresist) over the seed layer, forming (e.g., by plating) the conductive material(s) in the openings of the patterned mask layer and over the seed layer, and removing the mask layer and remove portions of the seed layer on which the conductive material(s) is not formed. Other methods for forming the UBM structures 127 are possible and are fully intended to be included within the scope of the present disclosure.

In some embodiments, a critical dimension (CD) (e.g., a width) C2 of the UBM structures 127 is between about 10 μm and about 100 μm, a pitch P2 between adjacent UBM structures 127 is between about 20 μm and about 200 μm, and a height H2 of the UBM structures 127 is between about 3 μm and about 30 μm.

As illustrated in FIG. 4, the redistribution structure 122 extends continuously from the CoW device 110A to the CoW device 110B. In particular, the redistribution structure 122 extends along and physically contacts the passivation layers 119 of the CoW devices 110A/110B and the upper surface of the molding material 118.

Although FIG. 4 illustrates one composite CoW device 150 formed over the carrier 102, more than one composite CoW devices 150 may be formed over the carrier 102 in a same processing step(s), and a subsequent dicing process may be performed to separate the composite CoW devices 150 into individual composite CoW devices, as one skilled in the art readily appreciates.

Figure 9:
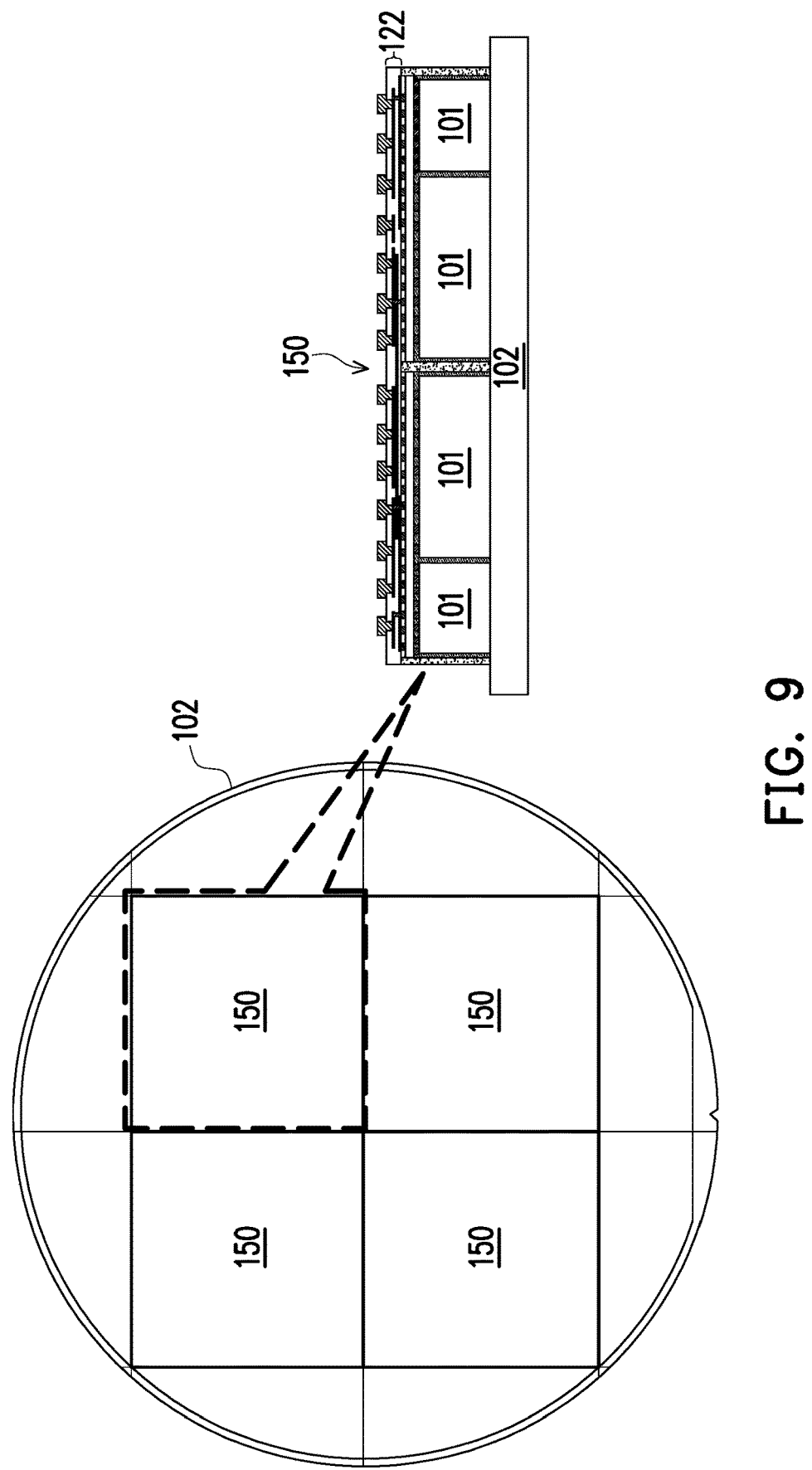
FIGS. 9 and 10 illustrate various top views of a wafer used in forming a CoW device, in some embodiments.
Figure 10:
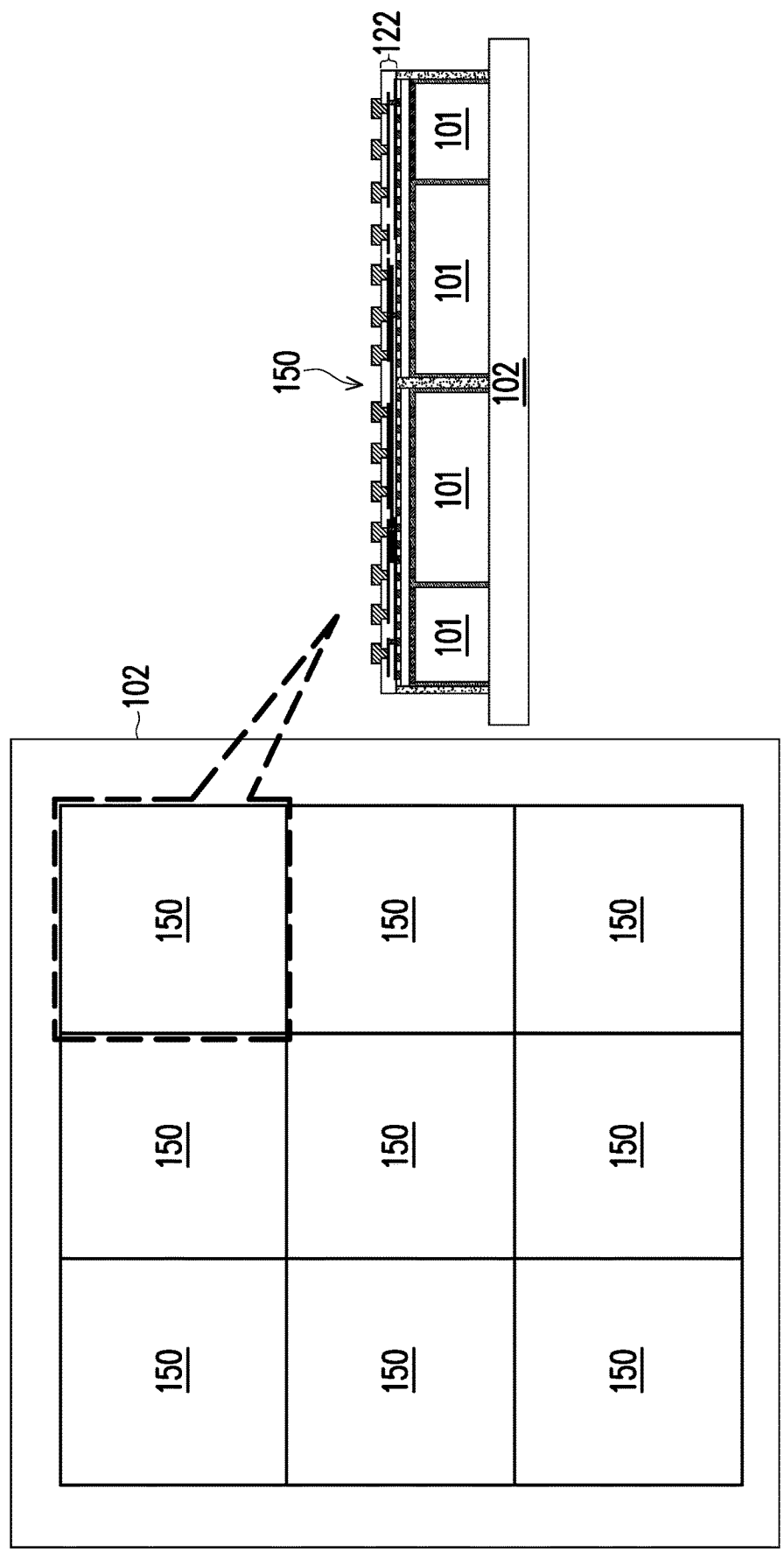

Referring temporarily to FIGS. 9 and 10, which illustrate various top views of a carrier 102 (e.g., a wafer) used in forming the composite CoW devices 150. In the example of FIG. 9, a plurality of composite CoW devices 150 are formed over the carrier 102, which carrier 102 has a circular shape in the top view. In FIG. 9, the dashed region corresponds to one composite CoW device 150, and four composite CoW devices 150 are illustrated as a non-limiting example. The number of composite CoW devices 150 formed on the carrier 102 may be any suitable number. In FIG. 10, the carrier 102 has a rectangular shape or a square shape. Nine composite CoW devices 150 are shown to be formed over the carrier 102 as a non-limiting example in FIG. 10, and the number of composite CoW devices 150 formed on the carrier 102 may be any suitable number.

Figure 5:
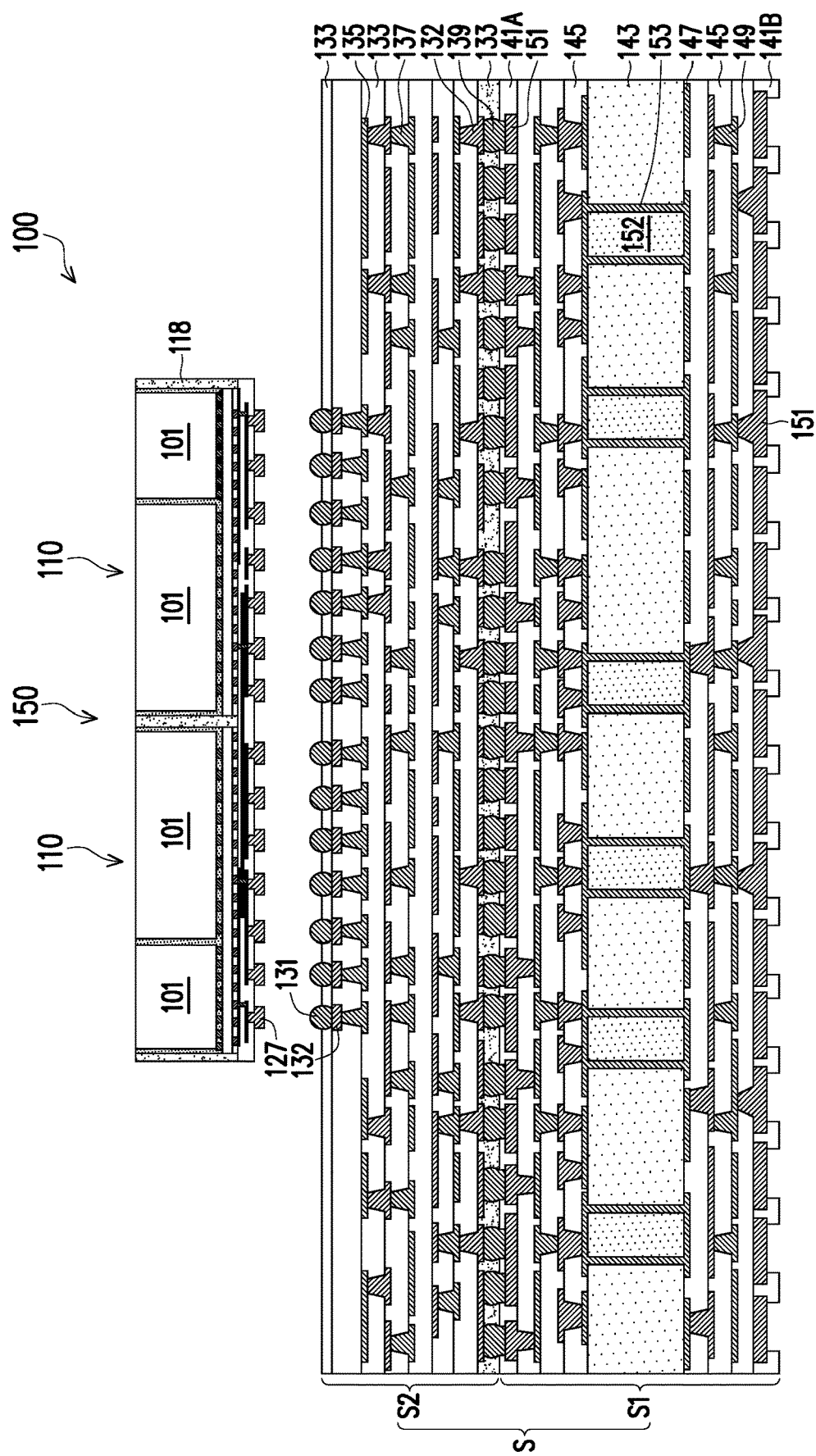

Next, in FIG. 5, a carrier de-bonding process is performed to detach the carrier 102 from the composite CoW device 150. The de-bonding process may remove the carrier 102 using any suitable process, such as etching, grinding, and mechanical peel off. In some embodiments where a LTHC release film is formed between the carrier 102 and the composite CoW device 150, the carrier 102 is de-bonded by shining a laser or an UV light over the surface of the carrier 102. Although not shown, a dicing processing may be performed after the carrier de-bonding process to singulate the plurality of composite CoW devices 150 (see FIGS. 9 and 10) formed over the carrier 102 into individual composite CoW devices 150. Due to the dicing process, the redistribution structure 122 and the molding material 118 of the composite CoW device 150 have a same width such that sidewalls of the redistribution structure 122 are aligned with respective sidewalls of the molding material 118, in some embodiments.

Still referring to FIG. 5, after the carrier de-bonding process and the dicing process, the composite CoW device 150 is flipped over, and the UBM structures 127 of the composite CoW device 150 are aligned with respective conductive pads 132 at an upper surface of a substrate S in preparation for bonding with the substrate S. In the example of FIG. 5, solder regions 131 are formed over the conductive pads 132. The solder regions 131 may be solder paste deposited over the conductive pads 132, or may be conductive bumps comprising solder formed over the conductive pads 132. In a subsequent reflow process, the solder regions 131 bond the composite CoW device 150 to the substrate S.

The substrate S of FIG. 5 includes an upper substrate S2 and a lower substrate S1. The upper substrate S2 is bonded to the lower substrate S1 through solder regions 139. In the illustrated embodiment, the upper substrate S2 and the lower substrate S1 are pre-formed (e.g., formed separately before being bonded together), and are bonded together by the solder regions 139, e.g., by a reflow process.

The lower substrate S1, which may be a printer circuit board (PCB), includes a core 143, which is formed of a dielectric material such as prepreg, epoxy, silica filler, Ajinomoto build-up film (ABF), polyimide, molding compound, or the like, in some embodiments. In some embodiments, the core 143 includes bismaleimide triazine (BT) resin, FR-4 (a composite material composed of woven fiberglass cloth with an epoxy resin binder that is flame resistant), ceramic, glass, plastic, tape, film, or other supporting materials. Vias 153 are formed extending through the core 143. In some embodiments, the vias 153 are formed by drilling through-holes in the core 143, and forming (e.g., plating) a conductive material (e.g., copper) along sidewalls of the through-holes. After the conductive material are formed along the sidewalls of the through-holes, remaining portions of the through-holes may be filled with a dielectric material 152, as illustrated in the example of FIG. 5.

Still referring to FIG. 5, conductive features, such as copper lines 147, copper vias 149, and/or copper pads 151, are formed on opposing sides of the core 143 and serve as redistribution layers to re-route electrical signals from a first location(s) of the substrate S1 to a second location(s) of the substrate S1. The conductive features are formed in a plurality of dielectric layers 145, which may be formed of a suitable dielectric material, such as ABF or prepreg. FIG. 5 further illustrates a topmost dielectric layer 141A and a bottommost dielectric layer 141B of the lower substrate S1. The topmost dielectric layer 141A and the bottommost dielectric layer 141B may be formed of, e.g., solder resist, ABF, or polyimide. Conductive pads 151 of the lower substrate S1 are exposed by openings in the topmost dielectric layer 141A and openings in the bottommost dielectric layer 141B.

The upper substrate S2 includes a plurality of dielectric layers 133 and conductive features (e.g., conductive lines 135, vias 137, and conductive pads 132) formed in the plurality of dielectric layers 133. The dielectric layers 133 are formed of a suitable dielectric material, such as prepreg, resin coated copper (RCC), molding compound, polyimide, photo image dielectric (PID), or the like.

In some embodiments, the dielectric layers 133 and the conductive features of the upper substrate S2 are formed over a carrier (not illustrated), using a same or similar processing steps (e.g., silicon fab processing techniques) as the redistribution structure 122. For example, the upper substrate S2 may be formed by forming a first dielectric layer (e.g., 133) over the carrier, forming first conductive features (e.g., 132) over the first dielectric layer (e.g., by plating), forming a second dielectric layer over the first conductive features, forming openings in the second dielectric layer to expose the first conductive features, forming a seed layer over the second dielectric layer and in the openings, forming a patterned photoresist with a designed pattern over the seed layer, plating (e.g., electroplating or electroless plating) a conductive material (e.g., copper) in the designed pattern and over the seed layer, and removing the photoresist and portions of seed layer on which the conductive material is not formed. The above process can be repeated to form additional layers of dielectric layers and additional layers of conductive features. The carrier is removed after the upper substrate S2 is formed. Solder regions 139, which may be solder paste or conductive bumps comprising solder, are formed on the conductive pads 132 of the upper substrate S2. Next, the conductive pads 132 at the lower surface of the upper substrate S2 are aligned with respective conductive pads 151 at the upper surface of the lower substrate S1, and a reflow process is performed so that the solder regions 139 bond the upper substrate S2 to the lower substrate S1. As illustrated in FIG. 5, the solder regions 139 extend at least partially through (e.g., extend into) the topmost dielectric layer 141A of the lower substrate S1 to bond with the conductive pads 151.

In some embodiments, the conductive pads 132 at the upper surface of the upper substrate S2 facing the composite CoW device 150 may be formed to have sizes (e.g., width, pitch) in the order of micro-meters that matches the sizes (e.g., width, pitch) of the UBM structures 127 of the composite CoW device 150 for proper alignment and electrical coupling with the composite CoW device 150. Recall that the upper substrate S2 is formed using silicon fab processing techniques, which allows formation of feature sizes in the order of micro-meters. The conductive pads 132 at the lower surface of the upper substrate S2 facing the lower substrate S1 may have larger sizes (e.g., width, and pitch) to match the sizes of the conductive pads 151 at the upper surface of the lower substrate S1 (e.g., a PCB) for proper alignment and electrical coupling with the lower substrate S1. Note that the conductive pads 151 may be formed using PCB manufacturing techniques, and therefore, may not be able to form conductive pads 151 with sizes that match those of the UBM structures 127 of the composite CoW device 150. Therefore, the disclosed structure of substrate S, with the upper substrate S2 serving as an interface between conductive pads of different sizes, allows proper alignment and coupling between the UBM structures 127 of the composite CoW device 150 and conductive pads 151 of the lower substrate S1 (e.g., a PCB).

Figure 6A:
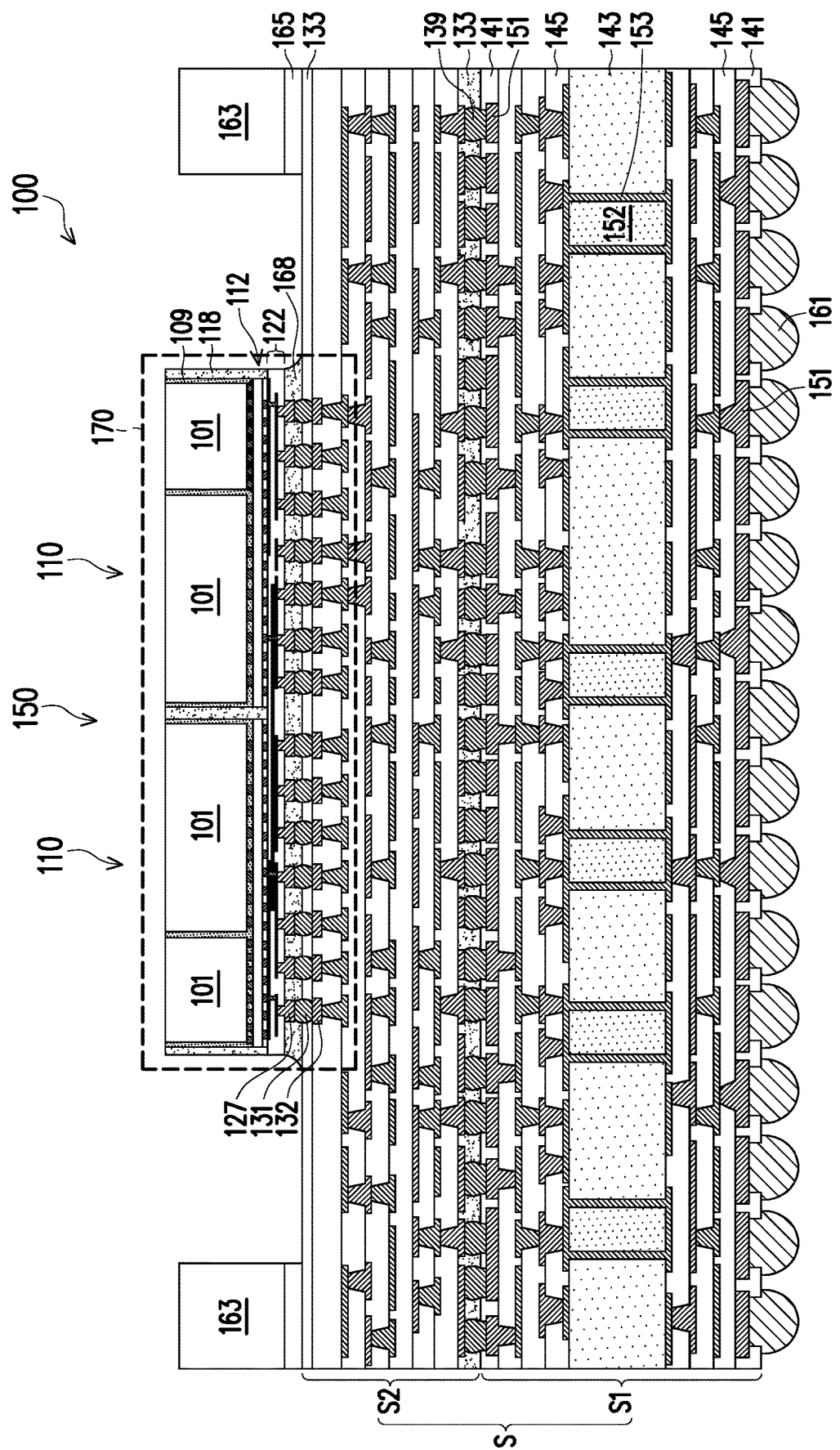

Next, in FIG. 6A, a reflow process is performed to bond the UBM structures 127 of the composite CoW device 150 to the conductive pads 132 of the upper substrate S2 through the solder regions 131. Next, an underfill material 168 is formed between the redistribution structure 122 of the composite CoW device 150 and the upper substrate S2. In some embodiments, the underfill material 168 is omitted. The semiconductor device 100 in FIG. 6A is a semiconductor package that includes the composite CoW device 150 bonded to the substrate S, thus have a Chip-On-Wafer-On-Substrate (CoWoS) structure. To distinguish the CoWoS structure of FIG. 6A from conventional CoWoS structure, the semiconductor device 100 in FIG. 6A may be referred to as a composite CoWoS device, or may be referred to as a semiconductor device having a composite CoWoS structure.

Next, a ring 163 is attached to the upper surface of the upper substrate S2 by an adhesive material 165. The ring 163 may be used to improve the planarity (e.g., flatness) of the substrate S. In some embodiments, the ring 163 is formed of a rigid material, such as steel, copper, glass, or the like. In an embodiment, the ring 163 is formed of a bulk material (e.g., bulk steel, bulk copper, bulk glass) to provide structural support, and there is no electrical component or electrical circuit inside the ring 163. In the illustrated embodiment, the ring 163 is a rectangular ring (e.g., having a hollow rectangle shape in a top view, see FIG. 6B), and is attached to substrate S such that the ring 163 surrounds the composite CoW device 150 (e.g., surrounds the dies 101 and the interposers 112). In the example of FIG. 6A, an upper surface of the ring 163 extends further from the substrate S than an upper surface of the interposers 112 (see label in FIG. 1) of the CoW devices 110.

FIG. 6A further illustrates external connectors 161 formed on the conductive pads 151 at the lower surface of the lower substrate S1. The external connectors 161 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The external connectors 161 may be formed using any suitable formation method.

Figure 6B:
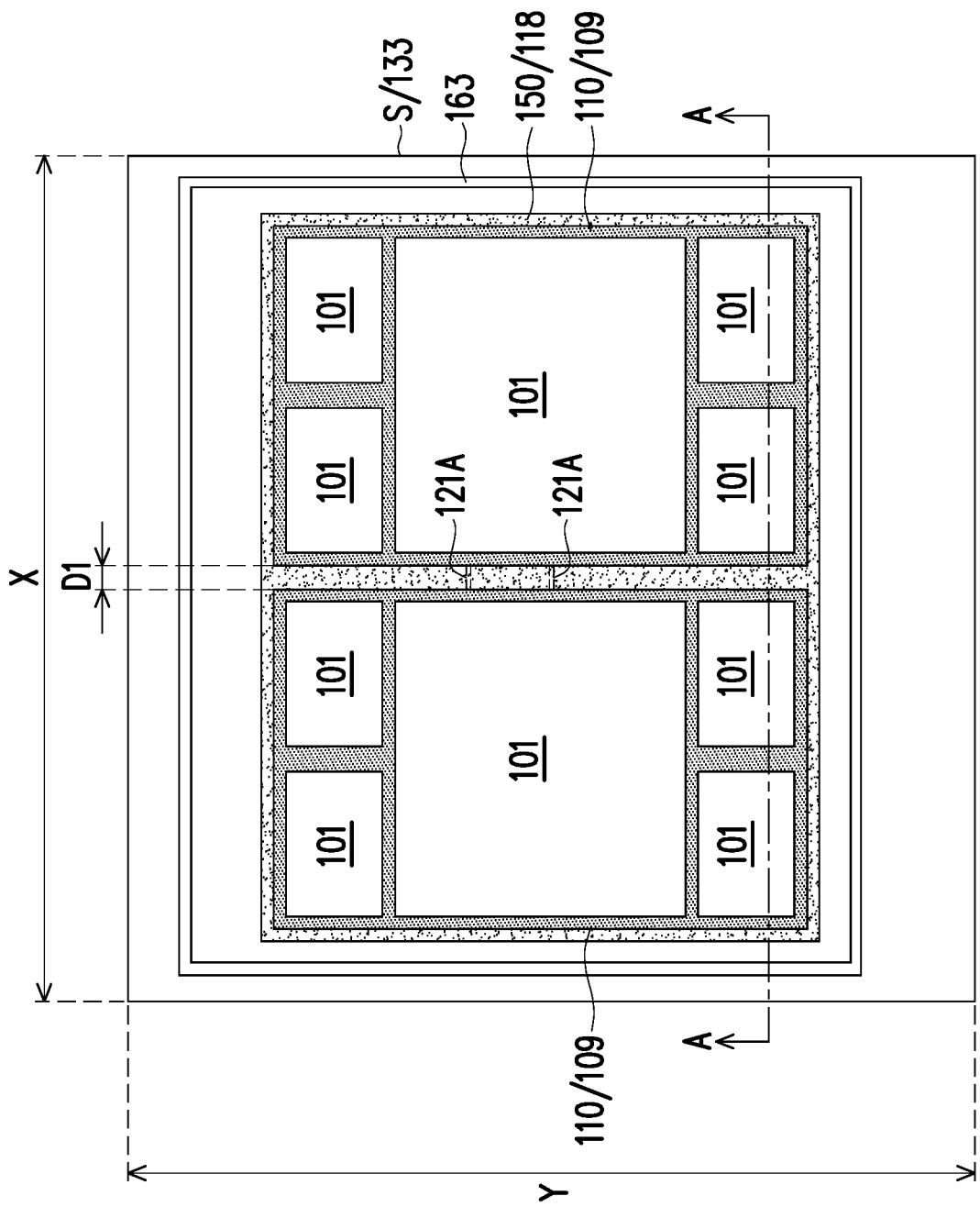

FIG. 6B illustrates a top view of the semiconductor device 100 of FIG. 6A, and FIG. 6A is a cross-sectional view along cross-section A-A of FIG. 6B. As illustrated in the non-limiting example of FIG. 6B, each of the CoW devices 110 in the composite CoW device 150 has five dies 101. The die 101 in the middle (the larger die) may be, e.g., a processor such as a central processing unit (CPU) or graphics processing unit (GPU), and the dies 101 at the corners (the smaller dies) may be, e.g., high bandwidth memories (HBM) dies. Note that in the top view of FIG. 6B, the boundary (e.g., perimeter) of the CoW device 110 overlaps with that of the molding material 109, the boundary of the composite CoW device 150 overlaps with that of the molding material 118, and the boundary of the substrate S overlaps with that of the topmost dielectric layer 133 of the upper substrate S2.

In some embodiments, a first dimension X and a second dimension Y of the semiconductor device 100 in FIG. 6B are between about 10 mm and about 75 mm. A distance D1 between the CoW devices 110 is between about 25 μm and about 500 μm. A thickness H3 of the composite CoW device 150 (see FIG. 7), measured between the backside of the dies 101 and the lower surface of the redistribution structure 122 facing the substrate S, is between about 100 μm and about 1500 μm. Although the size of the semiconductor device 100 is quite large (e.g., may be 75 mm by 75 mm), due to the unique architecture of the composite CoWoS device, the CPI risks are avoided or reduced.

FIG. 6B further illustrates in phantom the conductive lines 121A of the redistribution structure 122 that are disposed between the CoW devices 110, which conductive lines 121A are not visible in the top view of FIG. 6B. Note that the conductive lines 121A are formed during the formation of the redistribution structure 122, which uses silicon fab manufacturing processes. Therefore, very fine conductive lines 121A (e.g., with a line thickness of 2 μm) are able to be formed, which allows multiple conductive lines 121A to be formed in the small gap area between the CoW devices 110, and the sizes (e.g., width, pitch) of the conductive lines 121A match the sizes of the conductive pads 117 of the CoW device 110 for proper alignment and electrical connection.

Figure 7:
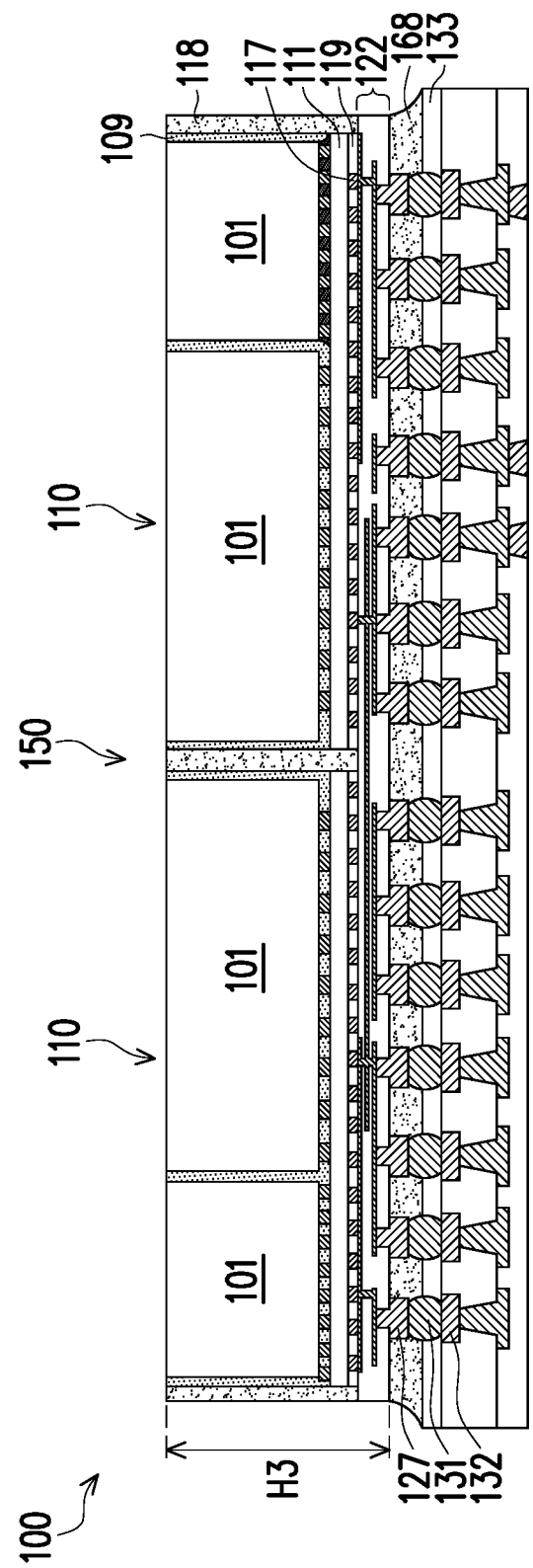
FIGS. 7 and 8 illustrate various embodiment cross-sectional views of a portion of a semiconductor device.

FIG. 7 illustrates a zoomed-in view of a portion 170 of the semiconductor device 100 illustrated in FIG. 6A. In the example of FIG. 7, each of the CoW device 110 in the composite CoW device 150 has a passivation layer 119 (e.g., a polymer layer) on the lower surface of the substrate 111. The passivation layer 119 surrounds and physically contacts the conductive pads 117 on the lower surface of the substrate 111 of the interposer. As a result, the passivation layers 119, the conductive pads 117, and the molding material 118 of the composite CoW device 150 have a coplanar (e.g., level) lower surface that physically contacts the redistribution structure 122. The redistribution structure 122 has a same width as the molding material 118 such that sidewalls of the redistribution structure 122 are aligned with respective sidewalls of the molding material 118.

Figure 8:
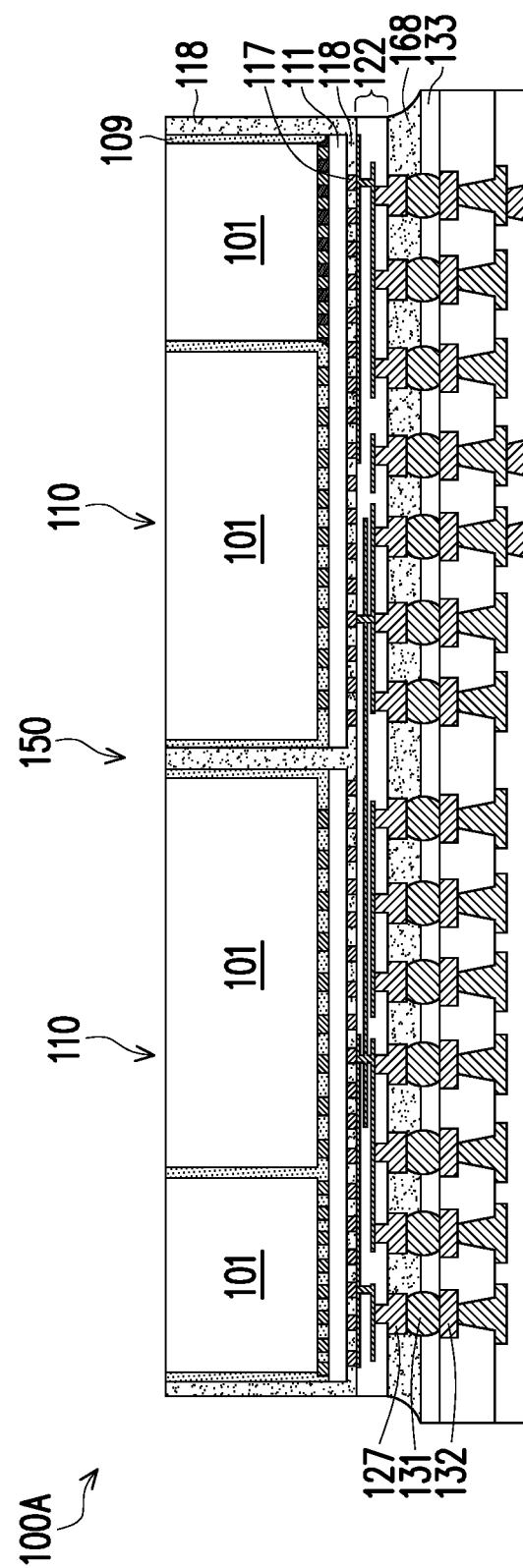

FIG. 8 illustrates a zoomed-in view of a portion of a semiconductor device 100A, in an embodiment. The semiconductor device 100A is similar to the semiconductor device 100 of FIG. 7, but in the embodiment of FIG. 8, the passivation layer 119 on the lower surface of the substrate 111 is omitted. As a result, the molding material 118 surrounds and physically contacts the conductive pads 117 on the lower surface of the substrate 111. Therefore, the molding material 118 and the conductive pads 117 have a coplanar (e.g., level) surface that physically contacts the redistribution structure 122. The redistribution structure 122 has a same width as the molding material 118 such that sidewalls of the redistribution structure 122 are aligned with respective sidewalls of the molding material 118.

Variations to the disclosed embodiments are possible and are fully intended to be included within the scope of the present disclosure. For example, the number of dies 101 inside each CoW device 110 and the location of each die 101 within the CoW device 110 may be modified without departing from the spirit of the present disclosure. In addition, the number of CoW devices 110 and the locations of the CoW devices 110 within a composite CoW device 150 may be modified without departing from the spirit of the present disclosure. In addition, although the substrate S in FIG. 6A comprises the upper substrate S2 bonded to the lower substrate S1, the substrate S may have other configurations, such as having a simpler configuration. For example, the substrate S may only have the upper substrate S2. Furthermore, other devices, such as an integrated passive device (IPD), may be bonded to the redistribution structure 122 and encapsulated by the underfill material 168. These and other variations are fully intended to be included within the scope of the present disclosure.

Embodiments may achieve advantages, such as reduced chip package integration (CPI) risks. The disclosed composite CoW device includes two or more CoW devices integrated together by a redistribution structure. This allows the size (e.g., surface area in a top view) of the composite CoW device 150 to be quite large (e.g., ≥3 reticles) and still avoids or reduces the bump fatigue risk due to high stress at, e.g., conductive connectors between the dies 101 and the interposer 112, especially at the corners of the interposer. The smaller interposer inside each of the CoW devices 110 reduces the cost of the interposer, and smaller interposer also alleviates the warpage of the interposer at the edge, and therefore, alleviates the stress of the conductive connectors at the corners of the interposer.

In addition, the disclosed embodiments allows large substrate (e.g., substrate S in FIG. 6A) with areas larger than 100 mm by 100 mm to be bonded with the composite CoW device 150 to form large semiconductor packages while avoiding or reducing various CPI issues such as cold joints and bump fatigue risk, thereby increasing bump joint yield and on-substrate assembly yield. In some embodiments, the average CTE of the materials used in the redistribution structure 122 is adjusted to have a target value (e.g., between 20 ppm/C° and 60 ppm/C°) to modify the warpage profile of the composite CoW device 150, such that composite device 150 has less warpage, or that the composite CoW device 150 has a same or similar warpage profile as the substrate S (e.g., both bend upwards or downwards) to facilitate bonding between them. Otherwise, if the composite CoW device 150 and the substrate S have opposite profiles (e.g., one bends upwards while the other bends downwards), bond them together will be difficult, and issues, such as bump fatigue risk, or cold joint, may arise. Other advantages include, for example, reduced cost of interposer, high component yield for the composite CoW device 150 due to the use of silicon fab process, and improved signal integrity due to, e.g., low dissipation factor Df (e.g., Df≤0.01) of the dielectric layers 125 in the redistribution structure.

Figure 11:
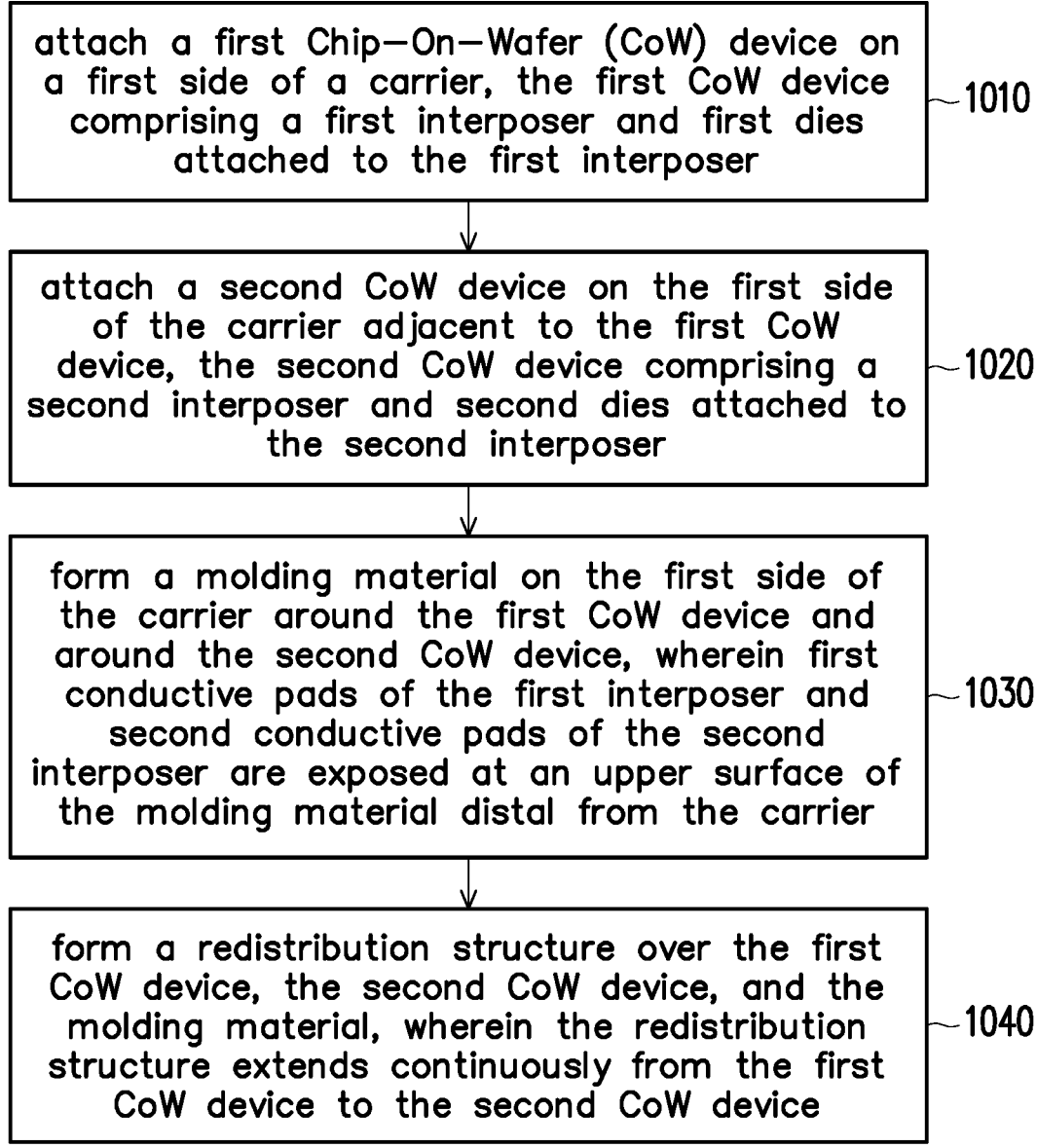
FIG. 11 illustrates a flow chart of a method of forming a semiconductor device, in some embodiments.

FIG. 11 illustrates a flow chart of a method of forming a semiconductor device, in some embodiments. It should be understood that the embodiment method shown in FIG. 11 is merely an example of many possible embodiment methods. One of ordinary skill in the art would recognize many variations, alternatives, and modifications. For example, various steps as illustrated in FIG. 11 may be added, removed, replaced, rearranged and repeated.

Referring to FIG. 11, at step 1010, a first Chip-On-Wafer (CoW) device is attached on a first side of a carrier, the first CoW device comprising a first interposer and first dies attached to the first interposer. At step 1020, a second CoW device is attached on the first side of the carrier adjacent to the first CoW device, the second CoW device comprising a second interposer and second dies attached to the second interposer. At step 1030, a molding material is formed on the first side of the carrier around the first CoW device and around the second CoW device, wherein first conductive pads of the first interposer and second conductive pads of the second interposer are exposed at an upper surface of the molding material distal from the carrier. At step 1040, a redistribution structure is formed over the first CoW device, the second CoW device, and the molding material, wherein the redistribution structure extends continuously from the first CoW device to the second CoW device.

In accordance with an embodiment, a semiconductor device includes: a first Chip-On-Wafer (CoW) device comprising a first interposer and a first die attached to a first side of the first interposer; a second CoW device comprising a second interposer and a second die attached to a first side of the second interposer, the second interposer being laterally spaced apart from the first interposer; and a redistribution structure extending along a second side of the first interposer opposing the first side of the first interposer and extending along a second side of the second interposer opposing the first side of the second interposer, the redistribution structure extending continuously from the first CoW device to the second CoW device. In an embodiment, the semiconductor device further includes a first molding material around the first CoW device, around the second CoW device, and between the first CoW device and the second CoW device, wherein the redistribution structure contacts and extends along a first side of the first molding material facing the redistribution structure. In an embodiment, the redistribution structure and the first molding material have a same width such that sidewalls of the redistribution structure are aligned with respective sidewalls of the first molding material. In an embodiment, the first interposer has first conductive pads at the second side of the first interposer, and has a first passivation layer at the second side of the first interposer around the first conductive pads, wherein the second interposer has second conductive pads at the second side of the second interposer, and has a second passivation layer at the second side of the second interposer around the second conductive pads, wherein the first conductive pads, the second conductive pads, the first passivation layer, the second passivation layer, and the first molding material have a coplanar surface facing the redistribution structure. In an embodiment, the first interposer has first conductive pads at the second side of the first interposer, and the second interposer has second conductive pads at the second side of the second interposer, wherein the first molding material surrounds and contacts the first conductive pads and the second conductive pads, wherein the first conductive pads, the second conductive pads, and the first molding material have a coplanar surface facing the redistribution structure. In an embodiment, the semiconductor device further includes a substrate having electrically conductive features, wherein the redistribution structure is physically and electrically coupled to a first surface of the substrate. In an embodiment, the redistribution structure is physically and electrically coupled to the first surface of the substrate by solder regions. In an embodiment, the semiconductor device further includes a ring attached to the first surface of the substrate, wherein the ring encircles the first CoW device and the second CoW device. In an embodiment, the semiconductor device further includes an underfill material between the redistribution structure and the first surface of the substrate. In an embodiment, the substrate comprises a lower substrate and an upper substrate, the upper substrate disposed between the lower substrate and the redistribution structure, wherein the upper substrate is bonded to the lower substrate by first solder regions, wherein the redistribution structure is physically and electrically coupled to an upper surface of the upper substrate facing away from the lower substrate by second solder regions. In an embodiment, the lower substrate includes: an dielectric core; vias extending through the dielectric core; dielectric layers on opposing sides of the dielectric core; electrically conductive features in the dielectric layers; and a first solder resist layer on an uppermost dielectric layer of the dielectric layers and a second solder resist layer on a lowermost dielectric layer of the dielectric layers, wherein the first solder regions extend into the first solder resist layer.

In accordance with an embodiment, a semiconductor device includes: a substrate comprising electrically conductive features; and a composite Chip-On-Wafer (COW) device attached to a first surface of the substrate. The composite CoW device includes: a first interposer; first dies coupled to a first side of the first interposer facing away from the substrate; a second interposer laterally spaced apart from the first interposer; second dies coupled to a first side of the second interposer facing away from the substrate; a first molding material around the first dies, the second dies, the first interposer, and the second interposer; and a redistribution structure extending continuously along a second side of the first interposer facing the substrate, along a second side of the second interposer facing the substrate, and along a first surface of the first molding material facing the substrate. In an embodiment, the redistribution structure comprises a conductive line between the first interposer and the second interposer, the conductive line electrically coupling at least one of the first dies to at least one of the second dies. In an embodiment, the semiconductor device further includes first solder regions between the first surface of the substrate and the redistribution structure. In an embodiment, the semiconductor device further includes an underfill material between the redistribution structure and the first surface of the substrate, wherein the underfill material surrounds the first solder regions. In an embodiment, the semiconductor device further includes a ring attached to the first surface of the substrate, an upper surface of the ring distal from the substrate extends further from the substrate than the first side of the first interposer.

In accordance with an embodiment, a method of forming a semiconductor device includes: attaching a first Chip-On-Wafer (CoW) device on a first side of a carrier, the first CoW device comprising a first interposer and first dies attached to the first interposer; attaching a second CoW device on the first side of the carrier adjacent to the first CoW device, the second CoW device comprising a second interposer and second dies attached to the second interposer; forming a molding material on the first side of the carrier around the first CoW device and around the second CoW device, wherein first conductive pads of the first interposer and second conductive pads of the second interposer are exposed at an upper surface of the molding material distal from the carrier; and forming a redistribution structure over the first CoW device, the second CoW device, and the molding material, wherein the redistribution structure extends continuously from the first CoW device to the second CoW device. In an embodiment, the redistribution structure electrically couples at least one of the first dies to at least one of the second dies. In an embodiment, the method further includes: removing the carrier; and after removing the carrier, bonding the redistribution structure to a first surface of a substrate using solder. In an embodiment, the method further includes attaching a ring to the first surface of the substrate, wherein the ring surrounds the first CoW device and the second CoW device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   attaching a first Chip-On-Wafer (CoW) device on a first side of a carrier, the first CoW device comprising a first interposer and a first die attached to the first interposer;
   attaching a second CoW device on the first side of the carrier adjacent to the first CoW device, the second CoW device comprising a second interposer and a second die attached to the second interposer;
   forming a molding material on the first side of the carrier around the first CoW device and around the second CoW device, wherein first conductive pads of the first interposer and second conductive pads of the second interposer are exposed at an upper surface of the molding material distal from the carrier;
   forming a redistribution structure over the first CoW device, the second CoW device, and the molding material, wherein a conductive line of the redistribution structure extends continuously from the first CoW device to the second CoW device;
   after forming the redistribution structure, removing the carrier; and
   after removing the carrier, bonding the redistribution structure to a first surface of a substrate.

2. The method of claim 1, wherein the redistribution structure electrically couples the first die to the second die.

3. The method of claim 1, wherein attaching the first CoW device comprises attaching the first die to the first side of the carrier such that the first die is between the carrier and the first interposer, wherein attaching the second CoW device comprises attaching the second die to the first side of the carrier such that the second die is between the carrier and the second interposer.

4. The method of claim 1, wherein the redistribution structure is formed using semiconductor fabrication processing techniques.

5. The method of claim 4, wherein a profile roughness parameter (Ra) Ra of conductive features of the redistribution structure is formed to be smaller than 0.1 μm.

6. The method of claim 5, wherein a dissipation factor (Df) Df of dielectric layers of the redistribution structure is formed to be smaller than 0.01.

7. The method of claim 1, further comprising attaching a ring to the first surface of the substrate, wherein the ring surrounds the first CoW device and the second CoW device.

8. The method of claim 1, wherein the redistribution structure has a first surface closest to the molding material and has a second surface furthest from the molding material, wherein the conductive line of the redistribution structure is formed between the first surface of the redistribution structure and the second surface of the redistribution structure.

9. The method of claim 8, wherein forming the redistribution structure comprises forming a plurality of dielectric layers successively over the molding material between the first surface of the redistribution structure and the second surface of the redistribution structure without a gap in between.

10. The method of claim 1, further comprising, after forming the redistribution structure and before removing the carrier, forming under bump metallurgy (UBM) structures over and electrically coupled to the redistribution structure, wherein bonding the redistribution structure comprises bonding the UBM structures to the substrate using solder.

11. A method of forming a semiconductor device, the method comprising:
   attaching a first semiconductor structure and a second semiconductor structure to a first side of a carrier, wherein the first semiconductor structure comprises a first interposer and a first die attached to the first interposer, and the second semiconductor structure comprises a second interposer and a second die attached to the second interposer;
   forming a molding material on the first side of the carrier around the first semiconductor structure, around the second semiconductor structure, and between the first semiconductor structure and the second semiconductor structure, wherein first conductive pads of the first interposer, second conductive pads of the second interposer, and the molding material have a coplanar surface distal from the carrier;
   forming a redistribution structure over and electrically coupled to the first interposer and the second interposer, wherein the redistribution structure extends continuously from the first interposer to the second interposer, wherein a conductive line of the redistribution structure is formed to extend continuously along an upper surface of the molding material from the first die to the second die; and after forming the redistribution structure, bonding the redistribution structure to a substrate.

12. The method of claim 11, wherein the conductive line of the redistribution structure is formed between a first surface of the redistribution structure contacting the molding material and a second surface of the redistribution structure furthest from the molding material.

13. The method of claim 12, wherein the redistribution structure comprise dielectric layers and conductive features, wherein the dielectric layers and the conductive features fill a space between the first surface of the redistribution structure and the second surface of the redistribution structure, and there is no gap between the first surface of the redistribution structure and the second surface of the redistribution structure.

14. The method of claim 13, wherein the conductive features are formed to be free of solder.

15. The method of claim 12, further comprising, after forming the redistribution structure and before bonding the redistribution structure, forming under bump metallurgy (UBM) structures at the second surface of the redistribution structure, wherein bonding the redistribution structure comprises bonding the UBM structures to the substrate using solder.

16. The method of claim 11, further comprising, after forming the redistribution structure and before the bonding, removing the carrier.

17. A method of forming a semiconductor device, the method comprising:

forming a composite Chip-On-Wafer (COW) device, comprising:

embedding a first CoW device and a second CoW device in a molding material, wherein the first CoW device comprises a first interposer and a first die attached to a first side of the first interposer, wherein the second CoW device comprises a second interposer and a second die attached to a first side of the second interposer, wherein first conductive pads of the first interposer and second conductive pads of the second interposer are exposed at a first surface of the molding material; and forming a redistribution structure over the first CoW device, the second CoW device, and the molding material, wherein a conductive feature of the redistribution structure extends continuously along the first surface of the molding material from the first CoW device to the second CoW device, wherein the conductive feature electrically couples the first die to the second die; and after forming the composite CoW device, bonding the redistribution structure to a substrate using solder.

18. The method of claim 17, wherein the first conductive pads are disposed at a second side of the first interposer opposing the first side of the first interposer, and the second conductive pads are disposed at a second side of the second interposer opposing the first side of the second interposer, wherein the second interposer is laterally spaced apart from the first interposer.

19. The method of claim 17, wherein forming the redistribution structure comprises forming dielectric layers and conductive features in the dielectric layers, wherein the conductive features are free of solder.

20. The method of claim 17, further comprising attaching a ring to the substrate around the composite CoW device.

* * * * *